United States Patent
Martin et al.

[11] Patent Number: 5,635,428
[45] Date of Patent: Jun. 3, 1997

[54] GLOBAL PLANARIZATION USING A POLYIMIDE BLOCK

[75] Inventors: Patrick M. Martin; Dennis J. Yost, both of Dallas, Tex.

[73] Assignee: Texas Instruments Incorporated, Dallas, Tex.

[21] Appl. No.: 329,108

[22] Filed: Oct. 25, 1994

[51] Int. Cl.$^6$ .................. H01L 23/316; H01L 21/02
[52] U.S. Cl. .................. 438/623; 438/624; 438/631; 438/699
[58] Field of Search .................. 437/228, 235, 437/238

[56] References Cited

U.S. PATENT DOCUMENTS

| | | | |
|---|---|---|---|
| 3,976,524 | 8/1976 | Feng | 156/8 |
| 4,505,025 | 3/1985 | Kurosawa et al. | 29/576 W |
| 4,662,986 | 5/1987 | Lim | 437/235 |
| 5,077,234 | 12/1991 | Scoopo et al. | 437/235 |
| 5,192,715 | 3/1993 | Sliwa, Jr. et al. | 437/195 |
| 5,212,114 | 5/1993 | Grewal et al. | 437/192 |
| 5,354,713 | 10/1994 | Kim et al. | 437/195 |
| 5,508,233 | 4/1996 | Yost et al. | 437/228 |
| 5,532,191 | 7/1996 | Nakano et al. | 437/228 |

FOREIGN PATENT DOCUMENTS

| | | | |
|---|---|---|---|
| 1091435 | 11/1989 | Japan | H01L 21/88 |
| 4142065 | 5/1992 | Japan | 437/235 |
| 5055182 | 3/1993 | Japan | 437/235 |

OTHER PUBLICATIONS

Wolf, Stanley, 'Si Proc. for the VLSI Era', vol. 2, Lattice Press (1990) pp. 233–235.

*Primary Examiner*—R. Bruce Breneman
*Assistant Examiner*—Matthew Whipple
*Attorney, Agent, or Firm*—Alan K. Stewart; Richard L. Donaldson; William B. Kempler

[57] ABSTRACT

A semiconductor device includes conductor regions 24 and 26 on a layer of the semiconductor device; a first insulator layer 28 over and between the conductor regions 24 and 26; polyimide regions 30, 32, and 34 over the first insulator layer 28 in gaps between the conductor regions 24 and 26; and a second insulator layer 38 over the first insulator layer 28 and over the polyimide regions 30, 32, and 34. A surface of the second insulator layer 38 is substantially planar.

3 Claims, 1 Drawing Sheet

GLOBAL PLANARIZATION USING A POLYIMIDE BLOCK

CROSS-REFERENCE TO RELATED APPLICATION

| Serial Number | Filing Date | TI Case No. | U.S. Pat. No. |
| --- | --- | --- | --- |
|  | 10/25/94 | TI 17298 | 5 508 233 |

FIELD OF THE INVENTION

This invention generally relates to semiconductor devices and fabrication methods. More specifically, the invention relates to global planarization of semiconductor devices using polyimide blocks.

BACKGROUND OF THE INVENTION

In multilayer semiconductor devices, excess topology or non-planarity is often introduced during fabrication by underlying partial structures, particularly levels of metal, such as metal lines or buses. Insulator layers over the underlying structures generally conform to the topology and introduce the same non-planarity. A result is that stress is introduced onto the device and crevices resulting from the non-planarity collect unwanted particles, both of which are causes for device degradation, such as, for example, short circuits and a concomitant reduction in ultimate yield. This non-planarity also causes a loss in metal interconnect linewidth control.

In the prior art, non-planarity problems are alleviated by a procedure known as resist etch back wherein a resist or other conformal material is spun over the non-planar layer having a thickness greater than the highest peak of the non-planar layer with a resulting planar or flat resist surface, regardless of the topology. The resist is then etched back with an etchant which etches the non-planar layer at the same etch rate as the resist until all of the resist has been removed and the former non-planar layer has been planarized.

SUMMARY OF THE INVENTION

Generally, and in one form of the invention, a semiconductor device includes conductor regions on a layer of the semiconductor device; a first insulator layer over and between the conductor regions; polyimide regions over the first insulator layer in gaps between the conductor regions; and a second insulator layer over the first insulator layer and over the polyimide regions. A surface of the second insulator layer is substantially planar.

An advantage of the invention is that it provides low cost global planarization with high throughput and lower dielectric capacitance.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
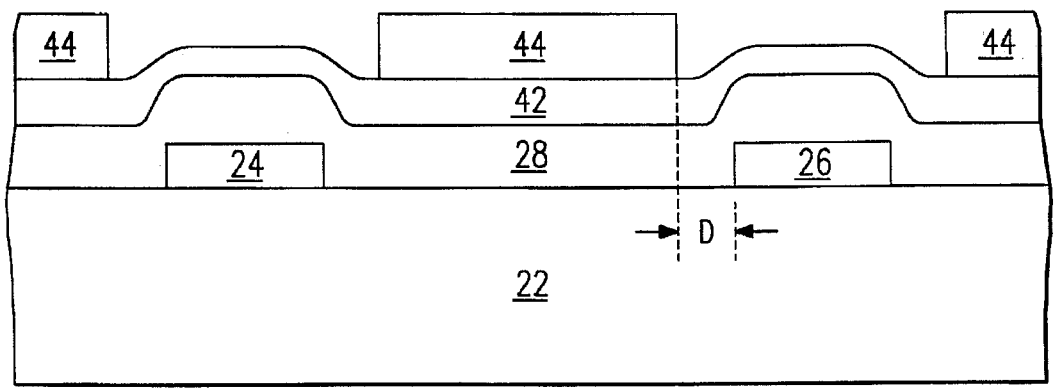
FIGS. 1 through 3 are cross-sectional views showing a preferred embodiment of the present invention in various states of fabrication.
Figure 2:
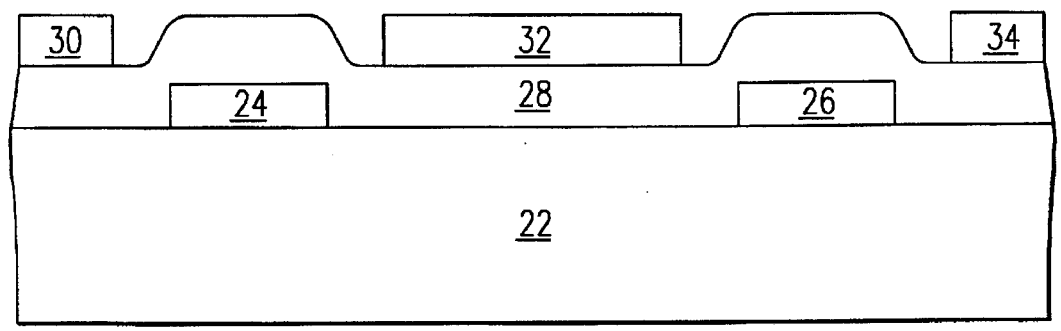
Figure 3:
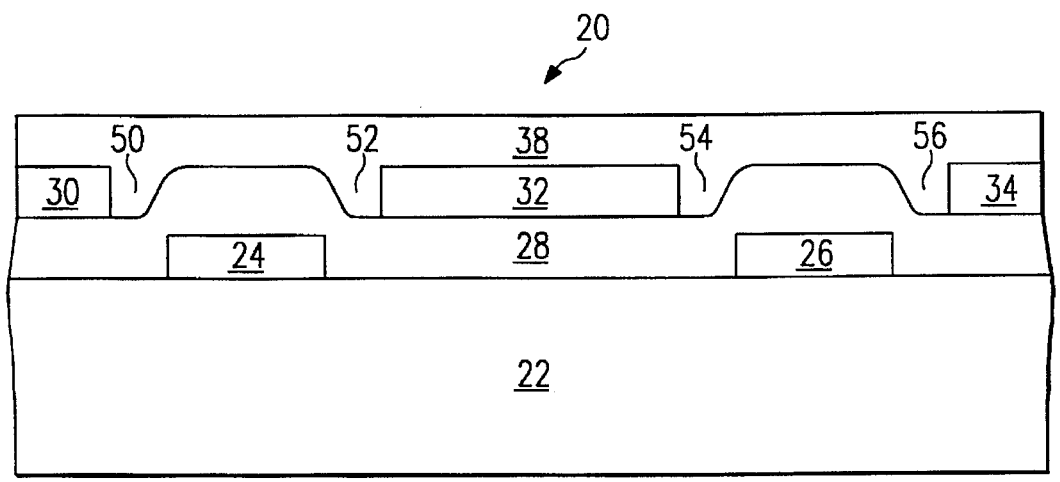

FIGS. 1-3 are cross-sectional diagrams showing a first preferred embodiment of the present invention and a method for forming the same. In FIGS. 1 through 3, a simplified process using polyimide blocks to achieve interlevel dielectric flatness between conducting layers is shown. This process uses a block of polyimide to achieve global planarization whereas conventional techniques either use chemical mechanical polishing or patterned resist etch back. In addition, polyimide is used to achieve lower dielectric capacitance.

The circuit 20, shown in FIG. 3, is the completed structure of the preferred embodiment. The circuit 20 includes region 22 which may contain semiconductor regions, insulator regions, and conductor regions; conductor regions (metal) 24 and 26, insulator layer (oxide) 28, polyimide regions 30, 32, and 34, and insulator layer (oxide) 38. Region 22 may contain semiconductor components such as transistors, capacitors, diodes, and resistors.

Referring to FIG. 1, there is shown a portion of a typical wafer under fabrication which includes region 22. A conductor layer is deposited over region 22, and patterned and etched to form conductor regions (metal) 24 and 26. An insulator layer (oxide) 28 is formed over the conductor regions 24 and 26 and over the region 22 in the areas where there are no conductor regions. Since the insulator layer 28 substantially tracks the topology below, the surface of insulator layer 28 is non-planar.

In order to eliminate this non-planarity, as shown in FIG. 1, a polyimide layer 42 is deposited, patterned, and etched to leave polyimide regions 30, 32, and 34 over the insulator layer 28 between the conductor regions. First the polyimide layer 42 is deposited over the insulator layer 28 to a thickness of approximately the thickness of the conductor regions 24 and 26. Photoresist 44 is then patterned, exposed, and developed to leave a pattern in between the conductor regions 24 and 26, as shown in FIG. 1. In the preferred embodiment, the inverse conductor pattern offset D, shown in FIG. 1, is approximately 1.5 microns. After completion of the pattern, the polyimide layer 42 is etched and the photoresist 44 is removed, as shown in FIG. 2. In the preferred embodiment, the polyimide layer 42 is etched using a wet etch in alcohol to remove all non-patterned areas. The remaining polyimide regions 30, 32, and 34 then fill in the large spaces in between the conductor regions 24 and 26. The polyimide regions 30, 32, and 34 are approximately the same thickness as the conductor regions 24 and 26, as shown in FIG. 2. The resulting gaps 50, 52, 54, and 56, shown in FIG. 2, are then easily filled by a conformal insulator (oxide) deposition 38, as shown in FIG. 3. Examples of the conformal insulator deposition are spin on glass, high pressure ozone TEOS, and dep-etch-dep oxide.

The embodiment described above is a simplified process for planarization using polyimide blocks to fill the large gaps between conducting leads to improve global planarization. This embodiment provides low cost global planarization with high throughput and lower dielectric capacitance.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A method for planarizing interlevel layers in a semiconductor device comprising:

forming conductor regions on a layer of the semiconductor device;

forming a first insulator layer over and between the conductor regions;

forming a polyimide layer over the first insulator layer;

patterning the polyimide layer with an etch resist material;

etching exposed portions of the polyimide layer to provide polyimide regions over the first insulator layer in gaps between the conductor regions and etching away all portions of the polyimide layer directly above the conductor regions so that gaps are formed between the polyimide layer and the first insulator layer, the polyimide regions are the same thickness as the conductor regions; and forming a second insulator layer over the first insulator layer and over the polyimide regions such that a surface of the second insulator layer will be substantially planar land wherein the second insulator layer is oxide and fills the gaps formed between the polyimide layer and the first insulator layer.

2. The method of claim 1 wherein the first insulator layer is oxide.

3. The method of claim 1 wherein the conductor regions are metal.

* * * * *